United States Patent
Dalton et al.

(10) Patent No.: US 7,049,209 B1
(45) Date of Patent: May 23, 2006

(54) DE-FLUORINATION OF WAFER SURFACE AND RELATED STRUCTURE

(75) Inventors: Timothy J. Dalton, Ridgefield, CT (US); Nicholas C. M. Fuller, Elmsford, NY (US); Kaushik A. Kumar, Beacon, NY (US); Catherine Labelle, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,463

(22) Filed: Apr. 1, 2005

(51) Int. Cl.
*H01L 21/322* (2006.01)

(52) U.S. Cl. ............... 438/477; 438/102; 438/104; 438/105; 438/412; 438/414; 438/423; 438/584; 438/117

(58) Field of Classification Search .......... 438/477, 438/102, 104, 105, 412, 414, 423, 584, 117
See application file for complete search history.

(56) References Cited

U.S. PATENT DOCUMENTS

| | | | |
|---|---|---|---|
| 5,079,481 A * | 1/1992 | Moslehi ............... | 315/111.41 |
| 5,207,836 A | 5/1993 | Chang | |
| 6,054,398 A | 4/2000 | Pramanick | |
| 6,204,192 B1 | 3/2001 | Zhao et al. | |
| 6,323,121 B1 | 11/2001 | Liu et al. | |
| 6,776,170 B1 * | 8/2004 | Liu ............... | 134/1.1 |
| 6,821,656 B1 * | 11/2004 | Dietrich et al. ....... | 428/701 |

FOREIGN PATENT DOCUMENTS

WO    WO02/13234    2/2002

* cited by examiner

*Primary Examiner*—W. David Coleman
*Assistant Examiner*—Su C Kim
(74) *Attorney, Agent, or Firm*—Todd M. C. Li; Hoffman, Warnick & D'Alessandro LLC

(57) ABSTRACT

Methods of de-fluorinating a wafer surface after damascene processing and prior to photoresist removal are disclosed, as is a related structure. In one embodiment, the method places the wafer surface in a chamber and exposes the wafer surface to a plasma from a source gas including at least one of nitrogen ($N_2$) and/or hydrogen ($H_2$) at a low power density or ion density. The exposing step removes the chemisorbed and physisorbed fluorine residue present on the wafer surface (and chamber), and improves ultra low dielectric (ULK) interconnect structure robustness and integrity. The exposing step is operative due to the efficacy of hydrogen and nitrogen radicals at removing fluorine-based species and also due to the presence of a minimal amount of ion energy in the plasma. The low power density nitrogen and/or hydrogen-containing plasma process enables negligible ash/adhesion promoter interaction and reduces integration complexity during dual damascene processing of low-k OSG-based materials.

18 Claims, 2 Drawing Sheets

DE-FLUORINATION OF WAFER SURFACE AND RELATED STRUCTURE

BACKGROUND OF THE INVENTION

1. Technical Field

The present invention relates generally to semiconductor fabrication, and more particularly, to methods of de-fluorinating a wafer surface after damascene processing and prior to photoresist removal, and related structure.

2. Related Art

Semiconductor devices include a plurality of circuits which form an integrated circuit (IC) including chips (e.g., chip back end of line, or "BEOL"), thin film packages and printed circuit boards. Integrated circuits can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of integrated circuits increase. Thus, the formation of multi-level or multi-layered interconnection schemes such as, for example, dual damascene wiring structures, have become more desirable due to their efficacy in providing high speed signal routing patterns between large numbers of transistors on a complex semiconductor chip. "Damascene" is a process in which interconnect patterns are first lithographically defined in the layer of dielectric then metal is deposited to fill resulting trenches and then excess metal is removed by means of chemical-mechanical polishing (CMP) (planarization). "Dual damascene" is a similar process in which two interlayer dielectric patterning steps and one CMP step create a pattern which would require two patterning steps and two metal CMP steps when using a conventional damascene process. Within the interconnection structure, metal vias run perpendicular to the silicon substrate and metal lines run parallel to the silicon substrate.

Presently, interconnect structures formed on an integrated circuit chip include at least about 2 to 8 wiring levels fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). In one class of structures, the thinwires are formed in a low dielectric constant (k) organosilicate (SiCOH) inter-level dielectric (ILD) layer, and the fatwires are made in a silicon dioxide ($SiO_2$) ILD having a dielectric constant of about 4.

One of the many challenges associated with the fabrication of the thin and fatwires for 65 nm and beyond complementary metal-oxide semiconductor (CMOS) technologies is the issue of ash (strip) induced modification of the ultra low-k (ULK) interlayer dielectric (ILD) material during single/dual damascene processing. For specific integration schemes, once the trench or via structure is defined during the damascene process flow, the resist (or other organic materials) must be removed. This resist removal is typically done using dry plasma processing conditions on the dual frequency capacitive (DFC) etch platform on which the damascene processing occurred (i.e., using in situ ashing) or on some other plasma etch/ash tool (i.e., ex situ ashing). However, the interconnected nature of the pore structure within these so-called ULK materials implies ready susceptibility to carbon removal and consequent moisture uptake upon exposure to various photoresist (organic material) removal plasmas, which rapidly destroys the ULK properties of the dielectric film. As such, there is significant demand for a suitable ash process for these specific integration schemes that employ ULK ILD technology which facilitates minimal/negligible ULK film modification. One such candidate is an ex situ downstream hydrogen-based process conducted at elevated temperature and pressure on a platform distinct from the DFC platform. In general, the use of a downstream plasma eliminates the possibility of ion impact to the ILD sidewalls and further minimizes the possibility of film modification. Thus, other downstream plasma chemistries may also be appropriate for enabling reduced ULK ILD film modification.

There are, however, a few issues with such an approach. First, the use of such a high flow and high pressure-based process (e.g., liters per minute and 100s of mTorr) facilitates potential removal of residual fluorine physisorbed onto the wafer surface post single/dual damascene processing. This physisorbed fluorine is present on the wafer surface after damascene processing (trench or via creation) as fluorine-based chemistries are necessary for etching these porous organosilicate glass (OSG) films on the DFC platform. During the downstream plasma ash process, however, physisorbed fluorine is liberated (by high gaseous flow~liters/min) from the wafer surface, which entices subsequent isotropic etching of the ULK film and other materials in the stack. This can be a particularly pernicious occurrence not only for the ULK film but also for the ILD adhesion promoter. Such ULK builds typically employ an inorganic adhesion promoter (15–30 nm thick layer) to improve the cohesive strength between the ILD and barrier layer films. If this adhesion promoter is consumed or partially consumed during the downstream plasma ash process, the integrity/consistency of the interconnect structure is inevitably compromised.

A further drawback of downstream ash options is the inability to remove chemisorbed fluorine present in the field area chemisorbed to the resist or other organic material. Since the etch chemistries utilized to define the damascene structures must be fluorine-based, post processing, the resist or organic planarizing layer that served as a pattern transfer layer typically has various carbon-flouride ($CF_x$) species chemisorbed onto its surface. The negligible presence of ions in a downstream plasma ash process (which is one of the advantages of the process from an ILD modification viewpoint) reduces the ability of the downstream plasma ash process to remove such chemisorbed fluorine-based residue. As a result, the field area of the wafer surface can be typically covered with such chemisorbed fluorine-based species after damascene (conducted on the DFC etcher) and downstream ash processing (conducted on the downstream asher). This residual chemisorbed fluorine is oftentimes removed post ash processing via some aqueous or non-aqueous means. Such wet processing, however, can potentially impact the dielectric properties of the ULK film.

Presently, there are approaches for performing cleans for miscellaneous applications that employ a nitrogen and/or hydrogen containing chemistry. However, these processes are inadequate for removing chemisorbed or physisorbed fluoride-based residues because they all employ ion current (~ion density×ion energy) conditions that would induce significant ULK film modification and/or plasma induced charging damage.

In view of the foregoing, there is a need in the art for a method that eliminates physisorbed and chemisorbed fluorine from a wafer surface associated with non-damaging downstream plasma photoresist removal of ULK interconnect builds.

SUMMARY OF THE INVENTION

The invention includes methods of de-fluorinating a wafer surface after damascene processing and prior to photoresist removal. In one embodiment, the method places the wafer surface in a chamber and exposes the wafer surface to a plasma from a source gas including at least one of nitrogen ($N_2$) and/or hydrogen ($H_2$) at a low power density or ion density. The exposing step removes the chemisorbed and physisorbed fluorine present on the wafer surface (and chamber), and improves ultra low dielectric (ULK) interconnect structure robustness and integrity. The exposing step is operative due to the efficacy of hydrogen and nitrogen radicals at removing fluorine-based species and also due to the presence of a minimal amount of ion energy in the plasma. The low power density nitrogen and/or hydrogen-containing plasma process enables negligible ash/adhesion promoter interaction and reduces integration complexity during dual damascene processing of low-k OSG-based materials; thus facilitating improved interconnect robustness, and device functionality and reliability. Further, the ability of the de-fluorination process to remove chemisorbed fluorine species facilitates a residue free wafer surface subsequent to downstream ash processing and, as such, reduces the need for using a wet processing option for removing such residues. These latter options can potentially impact the ILD film ULK properties.

A first aspect of the invention is directed to a method of de-fluorinating a wafer surface after damascene processing and prior to photoresist removal, the method comprising the steps of: placing the wafer in a process chamber; and exposing the wafer to a plasma from a source gas including nitrogen ($N_2$) and hydrogen ($H_2$) at a power density of no greater than approximately 0.4 W/cm$^2$ and a frequency of no less than approximately 27 MHz.

A second aspect of the invention includes a semiconductor structure comprising: a wafer having an ultra-low dielectric constant layer, wherein a surface of the ultra-low dielectric constant layer is substantially free of physisorbed and chemisorbed fluorine ($F_2$) prior to photoresist removal.

A third aspect of the invention is related to a method of de-fluorinating a wafer surface after damascene processing and prior to photoresist removal, the method comprising the steps of: placing the wafer in a process chamber; and exposing the wafer to a plasma from a source gas including at least one of nitrogen ($N_2$) and hydrogen ($H_2$) at an ion density of no less than approximately $1\times10^9$ cm$^3$ and no greater than $1\times10^{10}$ cm$^3$.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
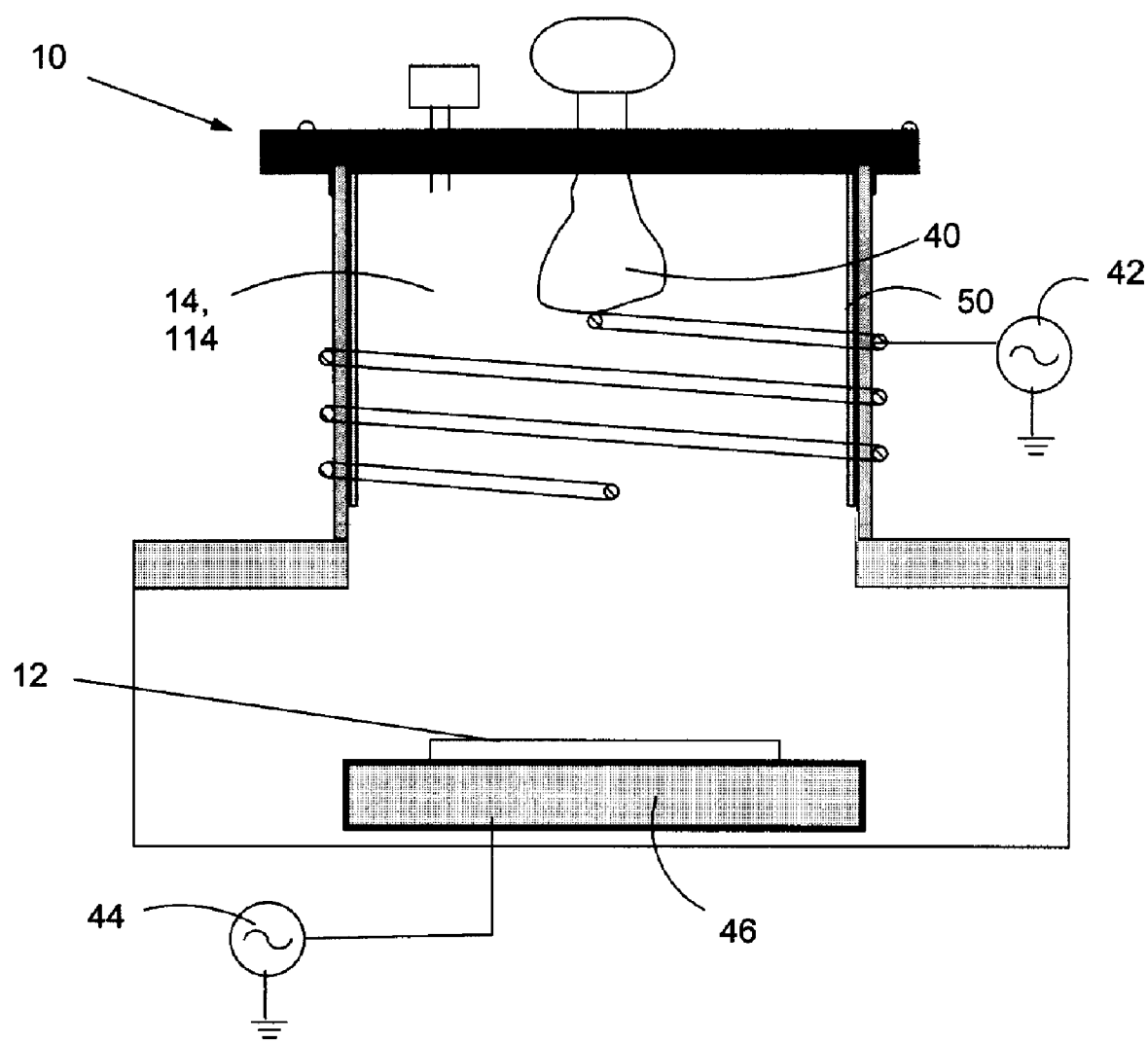
FIG. 1 shows an illustrative process chamber for one part of a method according to the invention.
Figure 2:
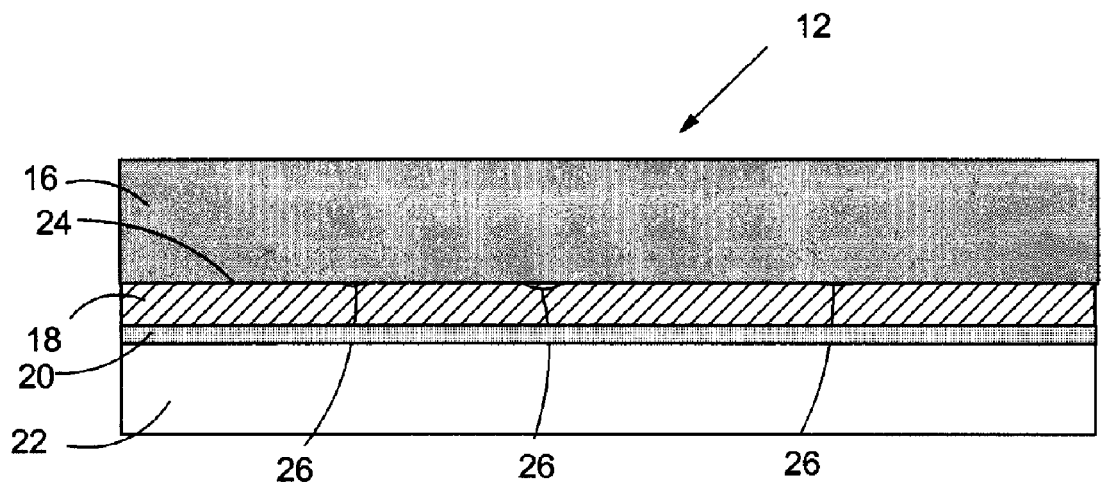
FIG. 2 shows an illustrative wafer for purposes of describing the invention.

With reference to the accompanying drawings, FIG. 1 shows a process chamber 10 including a wafer 12 to which a plasma 14 for removal of a photoresist 16 (FIG. 2) thereon will be applied. FIG. 2 shows an enlarged and simplified view of wafer 12. Wafer 12 includes an ultra-low dielectric constant (ULK) interlayer dielectric layer (ILD) layer 18. ULK ILD layer 18, in one embodiment, has a dielectric constant of no greater than approximately 2.5 and may include, for example, a dense or porous organosilicate glass (OSG). An adhesion promoter layer 20 may be provided between ULK ILD layer 18 and a lower layer 22 of wafer 12. Wafer 12 may include a number of other layers, not shown, as understood by one with skill in the art. A surface 24 of ULK ILD layer 18 (and wafer 12) may include physisorbed and/or chemisorbed fluorine residue 26.

A method of de-fluorinating a wafer surface 24 after damascene processing and prior to photoresist 16 removal will now be described. Process chamber 10 may include any now known or later developed process chamber used in the semiconductor industry. In one embodiment, however, process chamber 10 includes dual frequency capacitive (DFC) etch platform in which damascene processing can be performed.

In a first step, wafer 12 is placed in process chamber 10. As used herein, "placed" includes placing wafer 12 in a new process chamber or retaining it in the process chamber of a preceding process, e.g., damascene processing.

In a second step, wafer 12 is exposed to plasma 14 from a source gas 40 including at least one of nitrogen ($N_2$) and hydrogen ($H_2$) at a low power density, i.e., via source power source 42, to de-fluorinate wafer surface 24, and in particular, ULK ILD layer 18. This step is performed under minimal ULK ILD layer 18 modification conditions, namely, negligible power density, negligible ion current, and minimal processing time. In terms of power density, in one embodiment, plasma 14 has a negligible ion density of no less than approximately $1\times10^9$ cm$^3$ and no greater than $1\times10^{10}$ cm$^3$. A "low power density" is considered to be no greater than approximately 0.4 W/cm$^2$, which may be implemented by power source 42 having a power of less than approximately 300 W. In one embodiment, power source 42 has a frequency setting of no less than approximately 27 MHz. In terms of a negligible ion current, this can be achieved by having a bias power applied to wafer 12, i.e., via bias power source 44 and platen 46, at less than approximately 100 W and at a frequency of no greater than approximately 13.5 MHz. The exposing step removes fluorine ($F_2$) residue 26 from surface 24 of wafer 12, and from a wall 50 of process chamber 10. In one embodiment, the exposing step also includes applying a pressure of no less than approximately 10 mTorr and no greater than approximately 500 mTorr. In addition, a substrate temperature of approximately 20° C. may be applied.

Source gas 40 may include at least one of: a) nitrogen ($N_2$), b) hydrogen ($H_2$), c) nitrogen ($N_2$) and hydrogen ($H_2$), and d) ammonia ($NH_3$). Where nitrogen ($N_2$) and hydrogen ($H_2$) are both used, source gas 40 may include at least one of: a) nitrogen ($N_2$) and hydrogen ($H_2$), and b) ammonia ($NH_3$).

A subsequent step includes removing (ashing) photoresist 16 (FIG. 2). In one embodiment, the removing step includes exposing wafer surface 24 to a plasma 114 including helium (He) and hydrogen ($H_2$). However, other plasmas may be used. Plasma 114 may be applied at a temperature of no less than approximately 250° C. to no greater than approximately 350° C. It should be recognized that while plasma 114 is shown as part of plasma chamber 10, preferably the removing step is conducted on another downstream ash platform (not shown).

In one embodiment, the exposing, de-fluorination step is performed in the same process chamber 10, i.e., a dual frequency capacitive (DFC) etch platform, used for conducting precursor damascene processing (not shown) in wafer surface 24. The exposing, de-fluorination step is conducted subsequent to the damascene processing but prior to performing the downstream photoresist removal (ash) process on a separate downstream ash platform.

Figure 3:
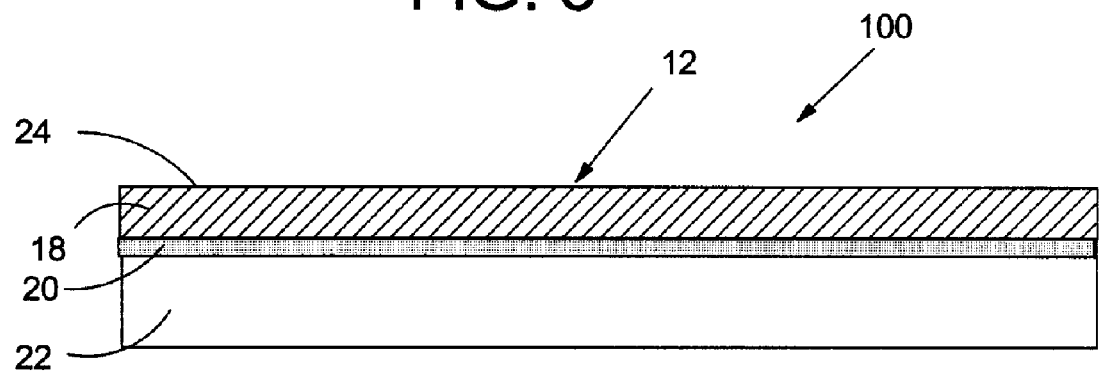
FIG. 3 shows a semiconductor structure formed according to the invention.

FIG. 3 shows wafer 12 with photoresist 16 removed and no fluorine ($F_2$) residue 26 (FIG. 2) in surface 24 of ULK ILD layer 18. A resulting semiconductor structure 100 includes wafer 12 having ULK ILD layer 18, wherein wafer surface 24 of layer 18 is substantially free of physisorbed and chemisorbed fluorine ($F_2$) residue after photoresist removal.

The invention is capable of removing physisorbed and chemisorbed fluorine residue from wafer surface 24 due to the relative efficacy of hydrogen and/or nitrogen radicals of removing fluorine-based species (for removing the physisorbed fluorine-based species) and also due to the presence of a definable amount of ion energy in the plasma (for removing the chemisorbed fluorine-based species). The invention, hence, enables increased interconnect robustness and potential reduced integration complexity by eliminating fluorine-based residues present on the wafer surface. The invention, thus, increases the interconnect and device reliability and functionality.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of de-fluorinating a wafer surface after damascene processing and prior to photoresist removal, the method comprising the steps of
   placing the wafer in a process chamber; and
   exposing the wafer to a plasma from a source gas including nitrogen ($N_2$) and hydrogen ($H_2$) at a power density of no greater than approximately 0.4 W/cm$^2$ and a frequency of no less than approximately 27 MHz.

2. The method of claim 1, wherein the placing step includes using the same process chamber as that used for the damascene processing for the exposing step, and wherein the exposing step removes fluorine residue from a wall of the process chamber.

3. The method of claim 1, wherein the exposing step has an ion density of no less than approximately $1\times10^9$ cm$^3$ and no greater than $1\times10^{10}$ cm$^3$.

4. The method of claim 1, wherein the exposing step includes applying a bias power to the wafer surface of less than approximately 100 W at a frequency of no greater than approximately 13.5 MHz.

5. The method of claim 1, wherein the exposing step includes applying a pressure of no less than approximately 10 mTorr and no greater than approximately 500 mTorr.

6. The method of claim 1, wherein the exposing step includes applying a substrate temperature of approximately 20° C.

7. The method of claim 1, wherein the source gas includes at least one of: a) nitrogen ($N_2$) and hydrogen ($H_2$), and b) ammonia ($NH_3$).

8. The method of claim 1, further comprising the step of removing a photoresist from the wafer surface by exposing the wafer to a plasma including helium (He) and hydrogen ($H_2$) at a temperature of no less than approximately 250° C. to no greater than approximately 350° C.

9. A method of de-fluorinating a wafer surface after damascene processing and prior to photoresist removal, the method comprising the steps of:
   placing the wafer in a process chamber; and
   exposing the wafer to a plasma from a source gas including at least one of nitrogen ($N_2$) and hydrogen ($H_2$) at an ion density of no less than approximately $1\times10^9$ cm$^3$ and no greater than $1\times10^{10}$ cm$^3$.

10. The method of claim 9, wherein the placing step includes using the same process chamber as that used for the damascene processing for the exposing step, and wherein the exposing step removes fluorine residue from a wall of the process chamber.

11. The method of claim 9, wherein the low density source power is no greater than approximately 0.4 W/cm$^2$.

12. The method of claim 9, wherein the low density source power has a frequency of no less than approximately 27 MHz.

13. The method of claim 9, wherein the exposing step includes applying a bias power to the wafer surface of less than approximately 100 W at a frequency of no greater than approximately 13.5 MHz.

14. The method of claim 9, wherein the exposing step includes applying a pressure of no less than approximately 10 mTorr and no greater than approximately 500 mTorr.

15. The method of claim 9, wherein the exposing step includes applying a substrate temperature of approximately 20° C.

16. The method of claim 9, wherein the source gas includes at least one of: a) nitrogen ($N_2$), b) hydrogen ($H_2$), c) nitrogen ($N_2$) and hydrogen ($H_2$), and d) ammonia ($NH_3$).

17. The method of claim 9, further comprising the step of removing a photoresist from the wafer surface by exposing the wafer surface to a plasma including helium (He) and hydrogen ($H_2$).

18. The method of claim 17, wherein the removing step includes applying a temperature of approximately 250° C. to approximately 350° C.

* * * * *